US008028207B1

(12) United States Patent  (10) Patent No.: US 8,028,207 B1
Villela et al.  (45) Date of Patent: Sep. 27, 2011

(54) EARLY MEMORY TEST

(75) Inventors: Caio Villela, Mountain View, CA (US); Liberie F. Cunha-Neto, Atlanta, GA (US)

(73) Assignee: Google Inc., Mountain View, CA (US)

( * ) Notice: Subject to any disclaimer, the term of this patent is extended or adjusted under 35 U.S.C. 154(b) by 648 days.

(21) Appl. No.: 11/238,482

(22) Filed: Sep. 28, 2005

(51) Int. Cl.
*G11C 29/00* (2006.01)
*G06F 9/00* (2006.01)

(52) U.S. Cl. .............................. 714/718; 714/721; 713/2

(58) Field of Classification Search ................. 714/718, 714/723
See application file for complete search history.

(56) References Cited

U.S. PATENT DOCUMENTS

| | | | |
|---|---|---|---|
| 6,173,382 B1 * | 1/2001 | Dell et al. ..................... | 711/170 |
| 6,910,157 B1 * | 6/2005 | Park et al. ..................... | 714/36 |
| 7,171,321 B2 * | 1/2007 | Best ............................ | 702/106 |
| 2002/0144191 A1 * | 10/2002 | Lin ............................. | 714/46 |
| 2003/0076125 A1 * | 4/2003 | McCord ........................ | 324/765 |
| 2005/0102568 A1 * | 5/2005 | Billick et al. .................. | 714/25 |

OTHER PUBLICATIONS

Intel Corp. and Microsoft Corp., PC 2001 System Design Guide—A Technical Reference for Designing PCs and Peripherals for the Microsoft® Windows® Family of Operating Systems, 1999-2000, pp. ii-vi and 29-43.
Microsoft Corp., Hardware Design Guide for Microsoft® Windows™ 95—A Practical Guide for Developing Plug and Play PCs and Peripherals, 1994, pp. iii-ix, 19-24, 33-52, 110-118, 144-156, 169-186, 232-242, and 281-288.

* cited by examiner

*Primary Examiner* — Jeffrey A Gaffin
*Assistant Examiner* — Daniel McMahon
(74) *Attorney, Agent, or Firm* — Stern, Kessler, Goldstein & Fox PLLC

(57) ABSTRACT

A PC BIOS can contain an early memory test that can identify a memory slot containing a bad memory. The BIOS can also contain a program module for using a communications port to report the identified memory slot. The communications port used for reporting is one that can be used without using system memory. In fact, the communications port can be used when there is no system memory installed in the PC. The parallel ports, LPT1 and LPT2 are such communications ports, as are the serial ports COM1 and COM2. An indicator can be electrically connected to the communications port to give a visual indication of a memory slot containing bad memory.

19 Claims, 5 Drawing Sheets

EARLY MEMORY TEST

TECHNICAL FIELD

Embodiments relate to the fields of computing systems, computer assembly, and computer maintenance. Embodiments also relate to the standardized PC architecture, PC motherboards, and PC BIOS. Embodiments additionally relate to using testing modules in the PC BIOS to discover, identify, and report bad memories without requiring a functional system memory.

BACKGROUND

In 1981, International Business Machines (IBM) introduced the IBM PC. Originally, PC was an acronym for "personal computer". Other personal computers were, or are, the Apple II, the MITS Altair, and the Macintosh. The PC architecture, however, was unique because it was not proprietary. As such, the PC architecture became an unintentional standard. Any company could design and build a PC compatible computer. A computer was PC compatible if it could use the same parts and run the same software as other PC compatible computers.

From 1981 until 1987, IBM controlled the PC architecture. Other companies, such as Compaq, built computers that were compatible with those that IBM designed and released. In 1987, IBM introduced the PS/2 line of personal computers that did not conform to the PC architecture that IBM itself had created. As such, in 1987 IBM lost control of the PC architecture. Until that time, an "IBM compatible" meant that it used a standard PC architecture. After that time, a computer using the PC architecture was simply called a "PC" or "PC compatible".

The reason PCs were so popular is that many manufacturers competed to make parts that could be assembled to produce computers that, more likely than not, would run Microsoft's Windows™ or MSDOS™ operating systems as well as a plethora of useful programs. The PC architecture allowed the hardware manufacturers to build computers while the software companies produced software. The separation of roles helped produce the PC revolution.

The PC architecture has evolved since 1981 with different manufacturers introducing variations on the basic design. The market did not accept some of the variations and they disappeared. The market accepted other variations and they flourished until supplanted. No single manufacturer or standards body has successfully and continuously controlled the PC architecture. It is constantly evolving with different groups competing to introduce variations and the market choosing the winners.

Microsoft and Intel collaborated to document the PC architecture and to drive it forward. The result was a series of design guides beginning with "Hardware Design Guide for Microsoft Windows 95". The "PC 2001 System Design Guide" is the last one of the series. Since then, the series has been supplanted by the Windows Logo certification program in which Microsoft documents how Windows™ and other programs can successfully interact with the evolving PC architecture. Due to their market dominance, Microsoft and Intel have been fairly successful in defining and guiding the PC architecture.

Just as IBM lost control of the PC architecture in 1987 because PC manufacturers did not produce PS/2 compatible computers, Microsoft and Intel may also be losing control. The reason is that Microsoft is meeting credible competition for open source operating systems and applications while Intel has lost significant market share to other manufacturers.

Regardless of who or what controls it, all PC architecture computers are direct descendants of the 1981 IBM PC. As such, they have certain things in common. They all have central processing units (CPUs) with instruction sets derived from the Intel 8088, which was the IBM PC's CPU. If there is a first line printer port (LPT1) it is located at IO address 0x378. A second line printer port (LPT2) is at 0x278. The line printer ports are often called legacy ports because certain "legacy free" PCs do not have them. Regardless, the defining characteristic of the PC and the PC architecture is the clear evolutionary path from the original IBM PC. This evolutionary path is not shared by any other computer architecture.

FIG. 4, labeled as "prior art", illustrates a high level block diagram of a PC compatible motherboard, meaning it is based on the PC architecture, in accordance with aspects of the embodiments. The components on the motherboard are divided into two groups, those that require high bandwidth communications and those that do not. The north bridge 102 coordinates communications between high bandwidth components such as the CPU 101, the system memory 103, the video subsystem 405, the Ethernet controller 406, and the south bridge 104. The south bridge 104 controls communications between low bandwidth devices and the north bridge 102. Some of the low bandwidth devices are the BIOS 105, LPT1 108, LPT2 409, the first serial port 410, the second serial port 411, the floppy drive 412, the PCI bus 413, the keyboard controller 414, the mouse controller 415, the firewire controller 416, the EIDE controller 417, the ATA controller 418, the USB controller 419, and the PCI express controller 420. Many of the low bandwidth devices are actually contained within the same computer chip as the south bridge 104.

In this document, a PC motherboard's LPT ports, serial ports, USB ports, firewire ports, and Ethernet port are all considered communications ports whereas its other components are not.

It is interesting to note that some components that were considered high bandwidth in the 1981 IBM PC architecture are now considered low bandwidth devices. For example, the 1981 IBM PC had an ISA bus that was considered quite fast. The ISA bus is no longer present, but the much faster PCI bus is. The PC architecture is currently evolving from the PCI bus to the much faster PCI Express bus. In 1981, the ISA bus was high bandwidth. In 2005, the PCI express bus is not. As the PC architecture continues to evolve, other buses and components will appear, disappear, and shift around.

FIG. 5, labeled as "prior art", illustrates memory and memory slots in accordance with aspects of the embodiments. A system memory 103 is shown in FIG. 4. The system memory 103 is made of one or more memories. A first memory 501, second memory 502, and third memory 503 are shown in FIG. 5. The first memory 501 is held in a first memory slot 117. The second memory 502 is held in a second memory slot 118. The third memory 503 is held in a third memory slot 119. The three memories 501, 502, 503 combined are the system memory. The three slots 117, 118, 119 are used to hold the memories 501, 502, 503 and to electrically connect them to the motherboard.

Those skilled in the arts of PC hardware maintenance, PC design, or PC manufacture are familiar with all the aspects of the PC architecture discussed herein. In particular, they are familiar with PC motherboards, PC motherboard components, PC memory, and PC memory slots.

When a PC boots, it accesses instructions in the BIOS and executes them. The instructions in the BIOS can test the PC hardware, prepare it to run the operating system, and then run the operating system. Occasionally, the BIOS tests discover malfunctioning hardware, such as a bad memory. When a hardware malfunction is serious enough, many BIOS implementations cause the computer to emit a series of sounds called beep codes. A technician can listen to the beep codes and diagnose the malfunction.

A PC memory can fail in a variety of ways. Three of the ways are: a misprogrammed serial presence detect (SPD) failure, a data strobe (DQS) calibration failure, and a retention failure.

Each dual in-line memory module (DIMM), or similar memory used in a PC architecture, has a non-volatile memory containing the information necessary for the BIOS to program the North Bridge memory controller. The information, which can include size, speed, number of columns, rows, ranks, banks, manufacturer, and serial number is vital. An SPD misprogramming failure occurs when a manufacturer forgets to store information in the SPD or stores the wrong information in the SPD. Such failures prevent the DIMM from being usable at all.

When a memory controller wants to read data from a DIMM, it sends a read command, delays a calibrated amount of time, and then latches the received data. The calibrated amount of time is the time for the read command to travel from the memory controller to the DIMM plus the time for the DIMM to fetch the data plus the time for the data to travel from the DIMM to the memory controller. These timings are so critical that the Northbridge manufacturer will usually specify down to the board level how the board needs to be designed. The specification includes printed circuit trace lengths and similar low level and precise details. As with all manufacturing processes, some variation is expected. The memory controller uses a data strobe, often carried by a wire with a DQS label, to control the precise timing for latching the data. The amount of time between receiving the data strobe and latching the data is set by a process called DQS calibration. DQS calibration ensures that the data is latched at the center of the data window. DQS calibration, however, can only compensate for a certain range of timing variation. If the amount of time required by a particular DIMM is outside the DQS calibration window then the DIMM is unusable. This is called a DQS calibration failure.

A retention failure occurs when a memory can not retain data for a long enough time period. When data is written to a memory and then immediately read back from the memory, the data read is usually equal to the data written. Over time, the data stored in any memory becomes corrupted. Under current architectural guidelines, a PC memory that cannot store data for more than a few milliseconds is deemed to suffer a retention failure.

The reason beep codes are used is that they can be used when nearly every PC component is failing or cannot be used. For example, malfunctioning system memory prevents the computer from accessing the Ethernet port, the video subsystem, and other PC components. Beep codes allow a PC to report diagnostic results even if a PC computer has no system memory at all.

The problem with beep codes is that many PCs are installed in noisy environments and some do not have speakers. For example, compute clusters can have many PCs installed in close proximity. Compute cluster environments are often very noisy and crowded. Many compute clusters lack speakers because the speakers can make even more noise and because the speakers often get in the way.

Another problem with beep codes is that upon encountering a bad memory, they simply report that the system memory is bad. Recalling FIG. 5, any one of the three memories 501, 502, 503 can be bad. A technician can diagnose which memory is bad by pulling out memories, swapping them in an out of the slots 117, 118, 119, and observing the boot up sequence. This can take considerable time and break additional hardware through handling. Handling damage can be aggravated when the technician is working in a cramped and unstable position which often happens because the diagnosis must often be performed in place. Another option is for the technician to simply replace all the memory and send the suspect memory elsewhere for diagnosis and testing. This option also involves unnecessary effort, logistics problems, and arguments if the diagnosis that takes place elsewhere does not match the environment in which the memory failed.

BRIEF SUMMARY

The following summary is provided to facilitate an understanding of some of the innovative features unique to the embodiments and is not intended to be a full description. A full appreciation of the various aspects of the embodiments can be gained by taking the entire specification, claims, drawings, and abstract as a whole.

It is therefore one aspect of the embodiments to overcome the shortcomings in current technology by providing systems and methods for using a communications port on a PC compatible motherboard to report the memory slot occupied by a bad memory instead of using a speaker and beep codes. The communications port used is one that can be operated without having any memories installed in the memory slots. During the initial boot sequence, instructions are obtained from a nonvolatile memory containing a BIOS.

It is also an aspect of the embodiments that the BIOS contains modules for testing the memories installed in the memory slots, identifying a memory slot containing a bad memory, and reporting the identified slot.

It is an aspect of certain embodiments to use the PC LPT1 or PC LPT2 port as the communications port. The LPT ports, also known as parallel ports, are well defined communications ports and familiar to many people who are tangentially aware of the PC architecture. The memory slot occupied by a bad memory can be reported as a pattern of high and low voltages on the pins of the LPT port connector.

It is also an aspect of certain embodiments to electrically connect an indicator to the communications port. The indicator is a piece of hardware that can display an indication of the memory slot containing a bad memory. For example, the indicator can contain a light emitting diode (LED) that it flashes in different sequences for different memory slots. For motherboards with three memory slots, the indicator can contain three LEDs and light the one corresponding to the slot, or slots, with bad memory. The indicator can contain a seven segment display and use it to display the number of the memory slot containing a bad memory.

It is also an aspect of certain embodiments for the BIOS to contain modules for testing different types of memory failure. Three possible modules are a module for finding a misprogrammed SPD, a module for finding a DQS calibration failure, and a module for finding a retention failure.

BRIEF DESCRIPTION OF THE DRAWINGS

The accompanying figures, in which like reference numerals refer to identical or functionally similar elements throughout the separate views and which are incorporated in and form a part of the specification, further illustrate the present invention and, together with the background of the invention, brief summary of the invention, and detailed description of the invention, serve to explain the principles of the present invention.

DETAILED DESCRIPTION

The particular values and configurations discussed in these non-limiting examples can be varied and are cited merely to illustrate embodiments and are not intended to limit the scope of the invention.

Overview

A PC BIOS can contain an early memory test that can identify a memory slot containing a bad memory. The BIOS can also contain a program module for using a communications port to report the identified memory slot. The communications port used for reporting is one that can be used without using system memory. In fact, the communications port can be used when there is no system memory installed in the PC. The parallel ports, LPT1 and LPT2 are such communications ports, as are the serial ports COM1 and COM2. An indicator can be electrically connected to the communications port to give a visual indication of a memory slot containing bad memory.

Architectural Overview

Figure 1:
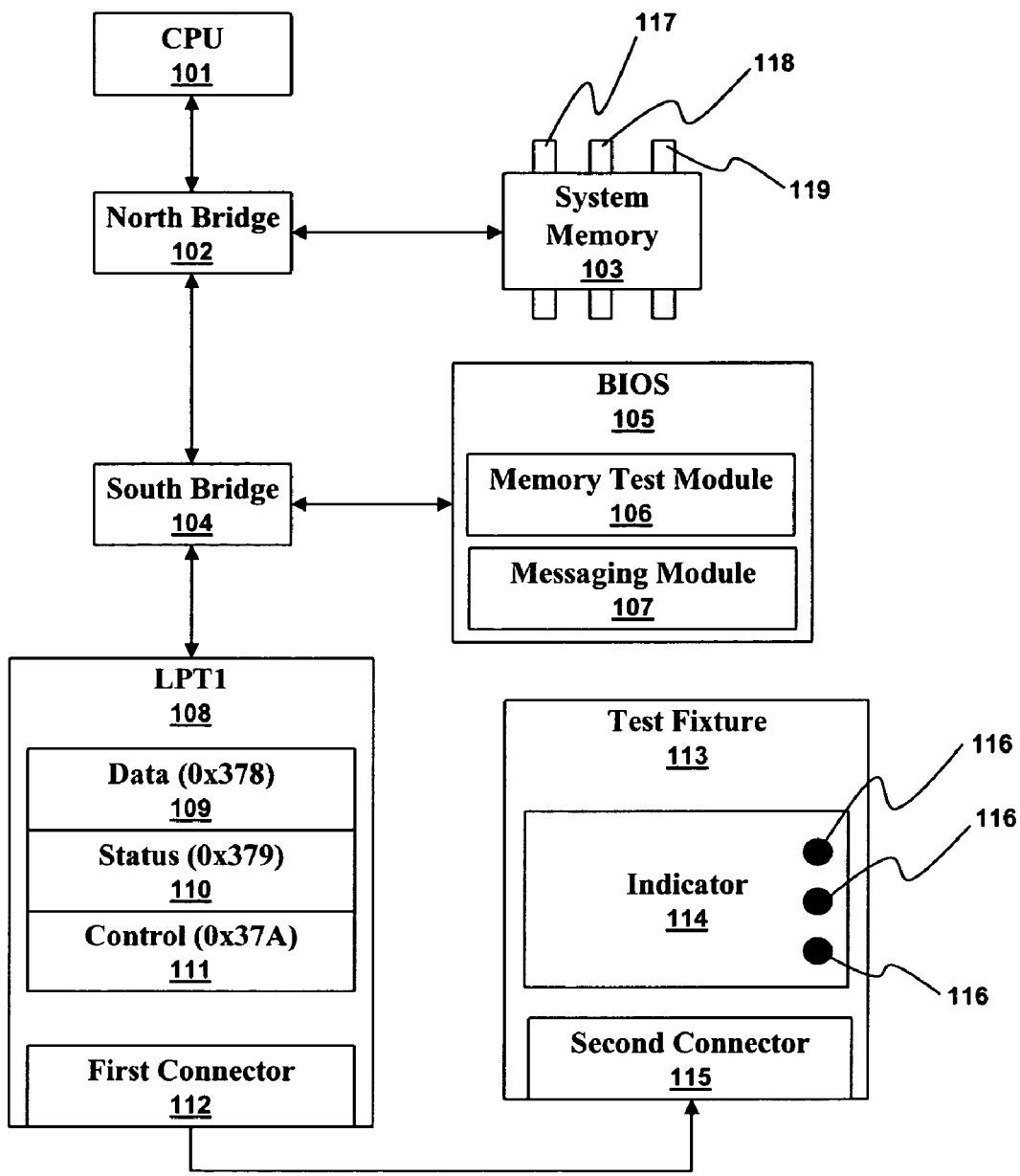
FIG. 1 illustrates a high level block diagram of a system that can report the memory slot containing a bad memory in accordance with aspects of the embodiments.

FIG. 1 illustrates a high level block diagram of a system that can report the memory slot containing a bad memory in accordance with aspects of the embodiments. The CPU 101 accesses the BIOS 105 by way of the north bridge 102 and south bridge 104. The BIOS 105 contains instructions that the CPU 101 can execute, such as the instructions in a memory test module 106 and a messaging module 107. The memory test module 106 contains programs for testing the system memory 103 which is made of memories (not shown) held inside memory slots 117, 118, 119. The system illustrated shows a first memory slot 117, second memory slot 118, and third memory slot 119 whereas other systems based on the PC architecture can contain more or fewer memory slots.

If a bad memory is identified, the memory slot 117, 118, 119 holding it is identified. The messaging module 107 contains instructions telling the CPU how to report the identified memory slot via a communications module. In FIG. 1, a PC standard LPT1 port 108 is shown as the communications module. The PC standard LPT1 port 108 is located at IO address 0x378 with data 109 at location 0x378, status 110 at address 0x379, and control 111 at address 0x37A. A similar port, LPT2, is located at address 0x278 with similar registers at 0x278, 0x279, and 0x27A. Those skilled in the arts of computer design, computer architecture, operating systems, or device drivers are aware of the properties and use of communications ports, registers, and IO addresses. The LPT1 port is shown with a first connector 112.

A test fixture 113 with an indicator 114 and a second connector 115 can be used to supply a visual indication of which memory slot contains a bad memory. The LPT1 is used to report the identified memory slot by placing a pattern of high and low voltages on the first connector 112. The second connector 115 and test fixture 113 ensure that an electrical connection is established between the first connector 112 and the indicator 114. The indicator 114 is shown with three light emitting diodes 116 for indicating which of the three memory slots 117, 118, 119 contains a bad memory.

The electrical connection between the indicator 114 and the first connector can be hot pluggable. Hot pluggable means that the electrical connection can be established while the pattern of high and low voltages are on the first connector 112. In practice, hot pluggability means that the PC can begin booting, detect a bad memory failure and report it. The indicator 114, however, is required for the report to be received because a technician must use an indicator 114 to observe the report. The technician can plug in the test fixture and immediately observe the report. Hot plugging is known to those practiced in the arts of electrical or electronic equipment operation and maintenance.

Figure 2:
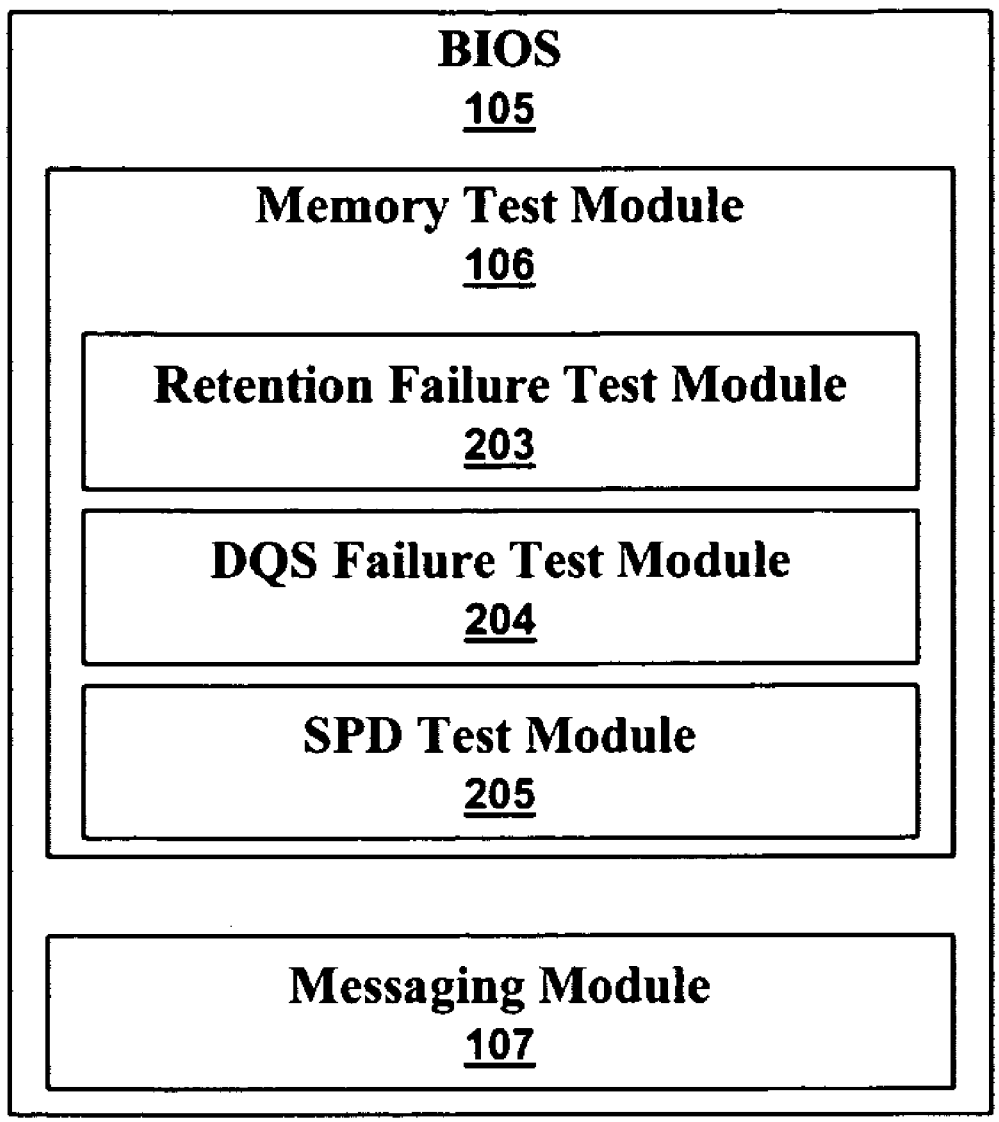
FIG. 2 illustrates a high level block diagram of a BIOS containing modules in accordance with aspects of the embodiments.

FIG. 2 illustrates a high level block diagram of a BIOS 105 containing modules in accordance with aspects of the embodiments. As in FIG. 1, the BIOS 105 contains a memory test module 106 and a messaging module 107. Here, however, the memory test module 106 contains other modules that can test for specific memory faults. The three modules are a retention test module 203, DQS failure test module 204, and a SPD test module 205.

High Level Process Flow

Figure 3:
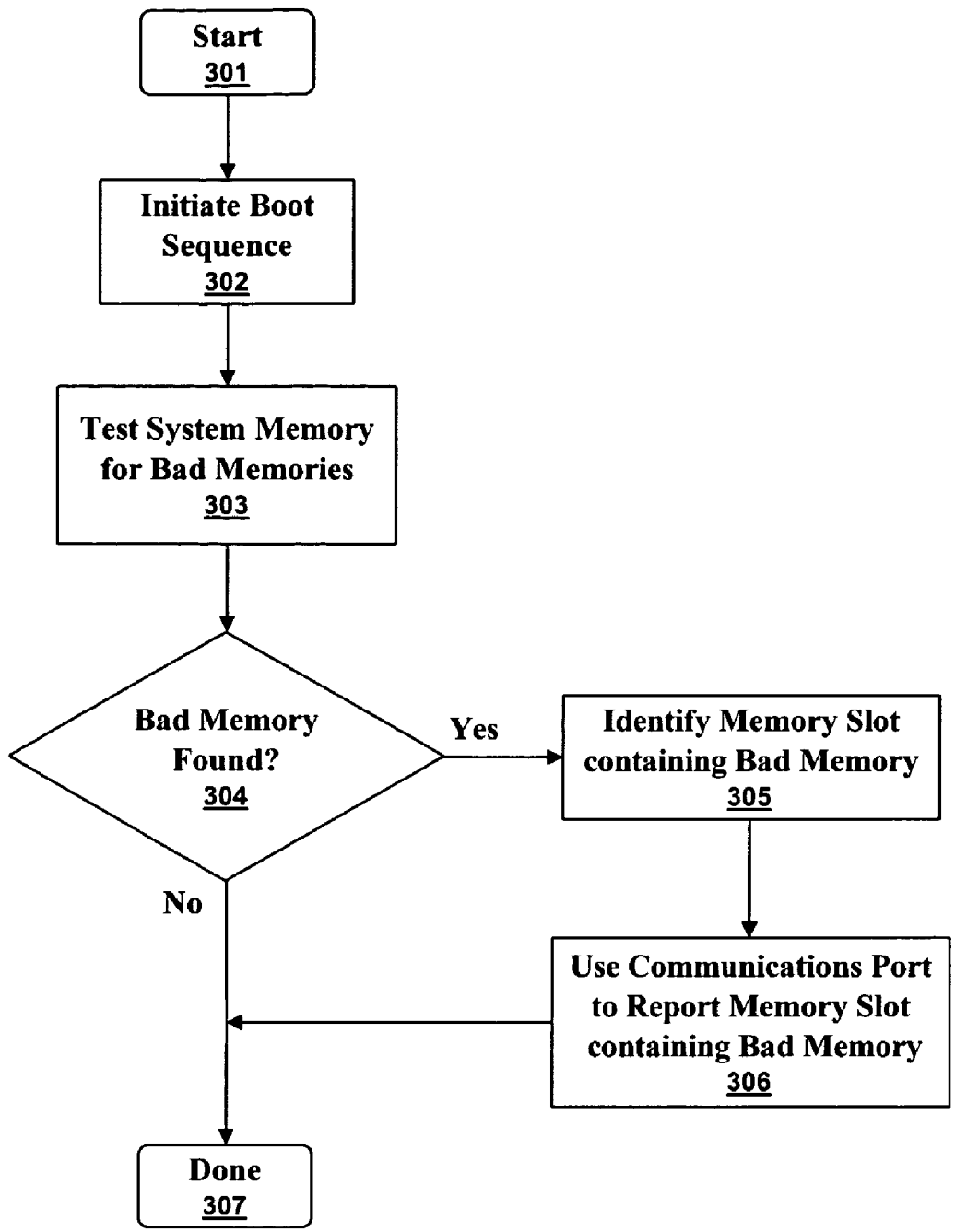
FIG. 3 illustrates a high level flow diagram of a PC finding and reporting a memory slot containing a bad memory in accordance with aspects of the embodiments.
Figure 4:
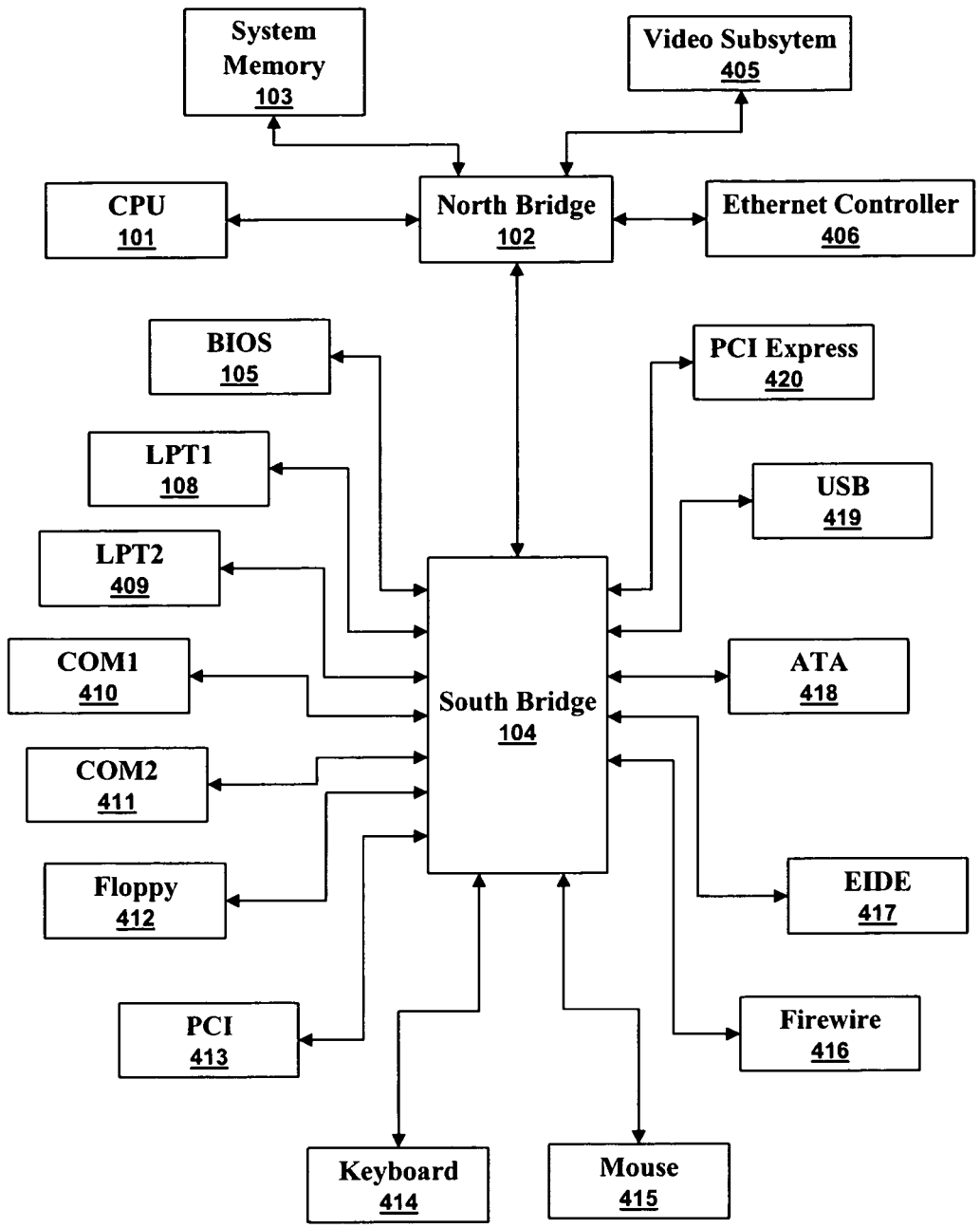
FIG. 4, labeled as "prior art", illustrates a high level block diagram of a PC compatible motherboard, meaning it is based on the PC architecture, in accordance with aspects of the embodiments.
Figure 5:
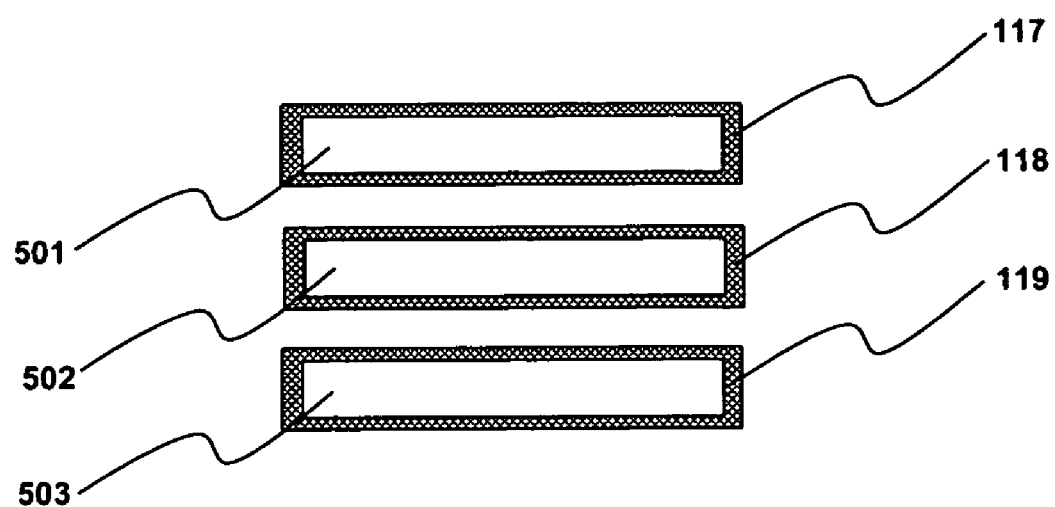
FIG. 5, labeled as "prior art", illustrates memory and memory slots in accordance with aspects of the embodiments.

FIG. 3 illustrates a high level flow diagram of a PC finding and reporting a memory slot containing a bad memory in accordance with aspects of the embodiments. After the start 301, the PC initiates the boot sequence 302. The system memory is tested 303 for bad memories. If none is found 304, the process completes 307. Otherwise, the memory slot containing the bad memory is found 305 and reported 306 via the communications port and then the process completes 307.

General

Embodiments can be implemented in the context of modules. In the computer programming arts, a module (e.g., a software module) can be implemented as a collection of routines and data structures that perform particular tasks or implement a particular abstract data type. Modules generally can be composed of two parts. First, a software module may list the constants, data types, variables, routines and the like that can be accessed by other modules or routines. Second, a software module can be configured as an implementation, which can be private (i.e., accessible perhaps only to the module), and that contains the source code that actually implements the routines or subroutines upon which the module is based. Thus, for example, the term "module", as utilized herein generally refers to software modules or implementations thereof. Such modules can be utilized separately or together to form a program product that can be implemented through signal-bearing media, including transmission media and recordable media.

The examples discussed above are intended to illustrate aspects of the embodiments. The phrases "an embodiment" or "certain embodiment" do not necessarily refer to the same embodiment or any specific embodiment.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system comprising:
   a computer motherboard comprising at least two memory slots wherein each of the at least two memory slots is configured to be uniquely identified with respect to other memory slots;
   a system memory comprising two or more memories wherein each one of the at least two memory slots is configured to hold a respective one of the two or more memories;
   a communications port on the computer motherboard that is configured to transmit a message without using the system memory;
   a nonvolatile memory containing a BIOS comprising a plurality of executable modules that are configured to be used to boot the system;
   a memory test module that is one of the plurality of executable modules and a messaging module that is one of the plurality of executable modules wherein the memory test module is configured to automatically perform a DQS calibration test at BIOS initialization on each of the two or more memories and create a bad memory identifier specifying which of the at least two memory slots holds a bad memory that failed the DQS calibration test, and wherein the messaging module is configured to report the bad memory identifier, without requiring that the system memory be functional.

2. The system of claim 1 wherein the communications port is a legacy LPT1 parallel port located at IO address 0x378 and wherein the bad memory identifier is reported as a pattern of high and low voltages on a first connector.

3. The system of claim 1 further comprising an indicator having a light emitting diode that corresponds to each memory and is used for reporting a bad memory.

4. The system of claim 1 wherein the indicator comprises at least one seven segment display to indicate which of the at least two memory slots contains a bad memory.

5. The system of claim 1 wherein the communications port is a legacy LPT2 parallel port located at IO address 0x278 and wherein the message is transmitted as a pattern of high and low voltages on a first connector.

6. The system of claim 1 wherein the memory test module comprises a misprogrammed SPD test module.

7. The system of claim 1 wherein the memory test module comprises a DQS calibration failure test module configured to perform a DQS calibration test at BIOS initialization.

8. The system of claim 1 wherein the memory test module comprises a retention failure test module.

9. A method comprising:
   booting a motherboard comprising a BIOS chip, a communications port, and at least two memory slots wherein each of the at least two memory slots is configured to be uniquely identified with respect to other memory slots;
   automatically testing each memory of a system memory comprising two or more memories for DQS calibration at BIOS initialization wherein each of the at least two memory slots is configured to hold a respective one of the two or more memories;
   upon finding a bad memory in one of the at least two memory slots, creating a bad memory identifier corresponding to one of the at least two memory slots holding the bad memory; and
   reporting the bad memory identifier without requiring the system memory to be functional.

10. The method of claim 9 further comprising indicating the bad memory identifier with an indicator when the indicator is electrically connected to the communications port, wherein the communications port is used to report a bad memory identifier.

11. The method of claim 9 wherein the communications port is a LPT1 port located at IO address 0x378 and wherein the bad memory identifier is reported as a pattern of high and low voltages on a first connector.

12. The method of claim 11 further comprising indicating the bad memory identifier with an indicator when the indicator is electrically connected to the LPT1 port.

13. The method of claim 9 further comprising:
    creating an electrical connection from the communications port to an indicator by plugging in a removable test device into a connector electrically connected to the communications port; and
    observing the bad memory identifier reported to the removable test device and indicated by the indicator.

14. The method of claim 9 wherein an indicator comprises at least one seven segment display to indicate which of the at least two memory slots contains a bad memory.

15. The method of claim 9 wherein the testing comprises testing for a misprogrammed SPD.

16. The method of claim 9 wherein the testing comprises testing for a DQS calibration failure.

17. The method of claim 9 wherein the testing comprises testing for a retention failure.

18. A system comprising:
    a means for automatically testing the system memory of a motherboard comprising two or more memory slots and a communications port, wherein the system memory comprises two or more memories that are held in the two or more memory slots, wherein the testing reveals which of the two or more memory slots holds a bad memory that failed a DQS calibration test at BIOS initialization, and wherein the testing does not require the system memory to be functional;
    a means for using the communications port to report which of the two or more memory slots holds a bad memory without requiring the system memory to be functional; and
    a means for reporting the bad memory identifier using an indicator.

19. A system comprising:
    a means for automatically testing system memory of a motherboard comprising two or more memory slots wherein each of the two or more memory slots is configured to be uniquely identified with respect to other memory slots and a communications port wherein the system memory comprises two or more memories that are held in the two or more memory slots, wherein the testing is performed on each of the two or more memories and uniquely identifies which of the two or more memory slots holds a bad memory that failed a DQS calibration test at BIOS initialization, and wherein the testing does not require the system memory to be functional; and
    a means for using the communications port to report which of the two or more memory slots holds a bad memory without requiring the system memory to be functional; and
    a means for reporting the bad memory identifier using an indicator.

* * * * *